United States Patent
Mikhael et al.

(10) Patent No.: US 11,270,838 B2
(45) Date of Patent: Mar. 8, 2022

(54) TRANSFORMER CIRCUITRY

(71) Applicant: SOCIONEXT INC., Kanagawa (JP)

(72) Inventors: David Hany Gaied Mikhael, Langen (DE); Bernd Hans Germann, Langen (DE); Ramkumar Ganesan, Langen (DE)

(73) Assignee: SOCIONEXT INC., Kanagawa (JP)

( * ) Notice: Subject to any disclaimer, the term of this patent is extended or adjusted under 35 U.S.C. 154(b) by 0 days.

(21) Appl. No.: 17/100,568

(22) Filed: Nov. 20, 2020

(65) Prior Publication Data
US 2021/0166866 A1 Jun. 3, 2021

(30) Foreign Application Priority Data
Nov. 29, 2019 (EP) .................................. 19212615

(51) Int. Cl.
*H01F 27/42* (2006.01)
*H01F 27/29* (2006.01)
*H03B 5/12* (2006.01)
*H01F 27/40* (2006.01)
*H03F 3/68* (2006.01)

(52) U.S. Cl.
CPC ............. *H01F 27/42* (2013.01); *H01F 27/29* (2013.01); *H01F 27/40* (2013.01); *H03B 5/124* (2013.01); *H03B 5/1212* (2013.01); *H03B 5/1215* (2013.01); *H03B 5/1243* (2013.01); *H03B 5/1296* (2013.01); *H03F 3/68* (2013.01)

(58) Field of Classification Search
CPC .......... H01F 27/42; H01F 27/29; H01F 27/40; H03B 5/1212; H03B 5/1296; H03B 5/124; H03B 5/1215; H03B 5/1243; H03F 3/68

USPC ........................... 331/167; 330/250; 336/105
See application file for complete search history.

(56) References Cited

U.S. PATENT DOCUMENTS

| | | | |
|---|---|---|---|
| 5,994,985 A | 11/1999 | Pehlke et al. | |
| 8,665,033 B2 | 3/2014 | Tang et al. | |
| 2010/0060370 A1* | 3/2010 | Chen | H03B 5/1293 331/117 FE |
| 2012/0075016 A1 | 3/2012 | Visser et al. | |
| 2013/0106507 A1 | 5/2013 | Signoff et al. | |
| 2016/0099691 A1* | 4/2016 | Babaie | H03F 1/0205 330/251 |
| 2018/0109225 A1 | 4/2018 | Jin et al. | |

OTHER PUBLICATIONS

Extended European Search Report dated May 20, 2020 in European Application No. 19212615.9.

* cited by examiner

*Primary Examiner* — Arnold M Kinkead
(74) *Attorney, Agent, or Firm* — McDermott Will & Emery LLP

(57) ABSTRACT

Transformer circuitry comprising: a transformer having a primary coil and a secondary coil, the primary coil having first and second primary terminals and the secondary coil having first and second secondary terminals, and a secondary coil driver configured to drive a secondary voltage signal V2 across the secondary terminals which has a target relationship with a primary voltage signal V1 driven across the primary terminals by a primary coil driver so that an inductance value measured between the primary terminals is governed by the target relationship.

18 Claims, 15 Drawing Sheets

*Prior Art*

*Prior Art*

TRANSFORMER CIRCUITRY

CROSS-REFERENCE OF RELATED APPLICATIONS

This application claims the benefit of European Patent Application No. 19212615.9, filed on Nov. 29, 2019, the entire disclosure of which Application is incorporated by reference herein.

The present invention relates to transformer circuitry, for example for use as an impedance (inductor). In particular, the present invention relates to such transformer circuitry where the impedance value (inductance) can be varied or "tuned".

One possible application of such transformer circuitry may be in tuned amplifiers having applications in circuits such as, for example, low-noise amplifier (LNA) circuits, video graphics array (VGA) circuits, clock buffer circuits and voltage controlled oscillator (VCO) buffer circuits in phase locked loops (PLLs). Example implementations of PLLs comprising such VCOs include analog-to-digital converters (ADCs), digital-to-analog converters (DACs), serialiser/deserialiser (SERDES) circuits, clock and data recovery (CDR) circuits, wireless transceivers and processor clocking circuits.

By way of background, a schematic diagram of a conventional resistive-load amplifier 10 will now be considered with reference to FIG. 1 in order to explore merely one potential application of the present invention. The resistive load amplifier 10 is a transconductance ($G_m$) amplifier configured to receive an input voltage signal across its input terminals Vin+ and Vin− (such as a differential clock signal, having an AC component) and output a current that is proportional to the AC input voltage signal. A resistive load R L is connected between the amplifier 10 and a voltage source VDD such that the amplifier 10 drives the resistive load R L with the output current. A differential output voltage signal is generated across output terminals Vout+ and Vout−. The resistive-load amplifier 10 exhibits a low-pass frequency response having a maximum operating frequency which is restricted by a pole created by the resistive load R L and parasitic capacitances present at nodes Vout+ and Vout−. In order to increase the maximum operating frequency of conventional resistive-load amplifiers, such as that illustrated in FIG. 1, the resistive-load may be replaced with an inductive-load.

FIG. 2 is a schematic diagram of a conventional inductive-load amplifier 20. The inductive-load amplifier 20 operates in the same way as the resistive-load amplifier of FIG. 1, but for the resistive-load R L replaced with an inductive-load L. The inductive load L is tuned to resonate with the (discrete and/or parasitic) capacitances $C_1$, $C_2$ present at nodes Vout+ and Vout− in order to obtain the desired frequency of the output voltage signal. The resulting amplifier is capable of generating high gain at a desired frequency.

Despite the provision of such an inductive-load amplifier 20, it has been found that the previously-considered inductive-load amplifier 20 suffers from a band-pass frequency response with narrow bandwidth. Furthermore, the range within which the centre frequency (i.e. resonant frequency) of such an inductive-load amplifier 20 may be tuned is very limited.

It is desirable to solve some or all of the above-mentioned problems.

According to an embodiment of a first aspect of the present invention, there is provided transformer circuitry comprising: a transformer having a primary coil and a secondary coil, the primary coil having first and second primary terminals and the secondary coil having first and second secondary terminals, and a secondary coil driver configured to drive a secondary voltage signal V2 across the secondary terminals which has a target relationship with a primary voltage signal V1 driven across the primary terminals by a primary coil driver so that an inductance value measured between the primary terminals is governed by the target relationship.

Thus, the inductance value measured across the primary terminals can be controlled by driving the secondary voltage signal V2 across the secondary terminal according to a target relationship. The target relationship between the primary voltage signal V1 and the secondary voltage signal V2 is a relationship that may result in a particular frequency being generated for the primary voltage signal V1 (for example, where the inductance measured between the primary terminals forms part of a resonant, e.g. LC, tank circuit of an oscillator circuit). That is, the inductance measured between the primary terminals is controlled based on the target relationship.

The primary output voltage V1 may be referred to as the output voltage of the primary coil driver. In embodiments where the primary coil driver is the relevant portion of a transconductance amplifier, the primary voltage signal V1 may be taken to be the output voltage of the relevant portion of the transconductance amplifier. Alternatively, in embodiments where the primary coil driver is the relevant portion of a voltage controlled oscillator, the primary voltage signal V1 may be taken to be the output voltage of the relevant portion of the voltage controlled oscillator (VCO), for example defined by differential output oscillator signals of the VCO.

Driving of the secondary voltage signal V2 by the secondary coil driver may be referred to as forcing or generating the secondary voltage signal V2 to be a particular voltage signal which is a scaled version of the primary voltage signal V1 in magnitude (i.e. in voltage). The target relationship may be a scaling factor between the primary and secondary voltage signals V1, V2, which scaling factor produces the desired inductance measured between the primary coils.

Similarly, driving of the primary voltage signal V1 by the primary coil driver may be referred to as generating a primary voltage V1 based on an input to the primary coil driver (e.g. from an external source).

The target relationship may be that the secondary voltage signal V2 is substantially proportional (in magnitude) to the primary voltage signal V1. A scaling factor may define the substantially proportional relationship between the two voltage signals V1, V2. For example, the primary and secondary voltage signals V1, V2 may be substantially the same, in which case the scaling factor would be 1:1, or the primary and secondary voltage signals V1, V2 may be substantially proportional to one another such that the primary voltage signal V1 is scaled by a scaling factor (e.g. of between 0 and 1, or between −1 and 1) in order to generate the secondary voltage signal V2.

The secondary coil driver may be configured to control the driven secondary voltage signal V2 based on the primary voltage signal V1 to maintain the target relationship. As discussed above, the driving of the secondary voltage signal V2 may be referred to as forcing or generating the secondary voltage V2 to be a particular voltage signal which is a scaled version of the primary voltage signal V1, according to the desired target relationship (e.g. a target relationship that may result in the desired primary voltage signal V1 frequency for example in the case of an oscillator circuit).

The primary coil may be electrically connected to the secondary coil via the secondary coil driver, and/or the secondary coil driver is electrically connected to the primary coil and/or to the primary coil driver. The electrical connections may be conductive paths that allow electrical currents to flow between the primary and secondary coils. Alternatively, the electrical connection may be conductive paths comprising one or more active components (e.g. transistors) that allow electrical currents to flow between the primary and secondary coils via the active components. Alternatively, the electrical connections may be conductive paths that comprise electrostatic connections (e.g. due to capacitors being inserted into the conductive path) that allow electrical currents (signals with an AC component) to flow between the primary and secondary coils via the electrostatic connections.

The secondary coil driver may comprise an amplifier connected between the primary coil and the secondary coil, the amplifier configured to generate the secondary voltage signal V2 based on the primary voltage signal V1 so that the target relationship is V2∝V1×A, where A is an amplification factor. The amplifier may be a voltage amplifier configured to amplify the primary voltage signal V1 by the amplification factor in order to generate the secondary voltage signal V2, according to the target relationship.

The amplification factor may alternatively be referred to as the scaling factor.

The secondary coil driver may be configured to control the amplification factor A based on a control signal to control the target relationship. The control signal may be received from an external source, such as an external controller or a user interface. The control signal may be an alternating current (AC) signal with a DC component.

The amplifier may comprise first and second sub-amplifiers, the first sub-amplifier connected between the first primary terminal and the first secondary terminal, and the second sub-amplifier connected between the second primary terminal and the second secondary terminal. The sub-amplifiers may apply the same amplification factor as one another.

The first and second sub-amplifiers may be configured to amplify components of the primary voltage signal V1. For example, the first sub-amplifier may amplify a positive component of the primary voltage signal V1 and the second sub-amplifier may amplify a negative component of the primary voltage signal V1.

A first control signal may control the first sub-amplifier and a second control signal may control the second sub-amplifier.

The first primary terminal may be electrically connected to the first secondary terminal via the first sub-amplifier and the second primary terminal is electrically connected to the second secondary terminal via the second sub-amplifier. As discussed above, the electrical connections may be conductive paths comprising one or more active components (e.g. transistors), and may also comprise electrostatic connections (e.g. due to capacitors being inserted into the conductive path) for passing AC components of signals.

The secondary coil driver may be implemented as the primary coil driver and a capacitor network (as an example of a passive impedance network) connected between the primary coil and the secondary coil, the capacitor network configured to apply a scaled version of the primary voltage signal V1 to the secondary coil as the secondary voltage signal so that the target relationship is V2∝V1×S, where S is a scaling factor. The capacitor network may be configured to scale the primary voltage signal V1 by the scaling factor in order to generate the secondary voltage signal V2, according to the target relationship.

The capacitor network may comprise varactors, and the secondary coil driver may be configured to control the scaling factor S based on a tuning voltage applied to the secondary coil to control the target relationship.

The capacitor network may comprise first and second capacitive potential dividers (as examples of passive-impedance potential dividers, or simply potential dividers), the first capacitive potential divider connected so that a voltage signal applied at the first secondary terminal is dependent on a voltage signal applied at the first primary terminal, and the second capacitive potential divider connected so that a voltage signal applied at the second secondary terminal is dependent on a voltage signal applied at the second primary terminal. The target relationship may therefore be obtained by using a capacitor network instead of an amplifier to scale the primary voltage signal V1 by a scaling factor in order to generate the secondary voltage signal V2.

Each of the capacitive potential dividers may comprise first and second capacitors connected together in series, so that the first capacitor of each capacitive potential divider is connected between a first node and an intermediate node of that potential divider, and the second capacitor of each capacitive potential divider is connected between the intermediate node and a second node of that potential divider. For the first capacitive potential divider, the first node is connected to the first primary terminal and the intermediate node is connected to the first secondary terminal, and, for the second capacitive potential divider, the first node is connected to the second primary terminal and the intermediate node is connected to the second secondary terminal.

For the first and second capacitive potential dividers, the second node may be connected to a voltage source node.

For the first capacitive potential divider, the second node may be connected to the second primary terminal, and for the second capacitive potential divider, the second node may be connected to the first primary terminal.

For at least one of the capacitive potential dividers, at least one of its capacitors is a variable capacitor, and wherein the secondary coil driver is configured to control the capacitance value of the at least one variable capacitor based on a control signal to control the target relationship, or, for at least one of the capacitive potential dividers, at least one of its capacitors is a varactor, and wherein the secondary coil driver is configured to control a tuning voltage applied to the secondary coil based on a control signal to control the target relationship. The tuning voltage may be applied to the centre tap of the secondary coil. Furthermore, the tuning voltage may be connected to a fixed potential such as an external voltage source.

The first primary terminal may be electrically connected to the first secondary terminal via the first capacitive potential divider and the second primary terminal may be electrically connected to the second secondary terminal via the second capacitive potential divider. As discussed above, the electrical connections may be conductive paths that comprise electrostatic connections (e.g. due to capacitors being inserted into the conductive path), i.e. which provide AC-coupling and DC-decoupling.

The primary coil driver may be part of an amplifier or part of an oscillator. For example, the primary coil driver may comprise a portion of the amplifier or the oscillator from which an output voltage is output.

According to an embodiment of a second aspect of the present invention, there is provided transformer circuitry comprising: a transformer having a primary coil and a secondary coil, the primary coil having first and second primary terminals and the secondary coil having first and second secondary terminals, and a secondary coil controller configured to selectively short circuit or open circuit the secondary coil to control an inductance value measured between the primary terminals.

According to an embodiment of a third aspect of the present invention, there is provided amplifier circuitry comprising the transformer circuitry of any of the aforementioned aspects, optionally wherein the amplifier is inductive-load amplifier circuitry and the transformer forms an inductive load of the inductive-load amplifier circuitry.

According to an embodiment of a fourth aspect of the present invention, there is provided oscillator circuitry comprising the transformer circuitry of any of the aforementioned aspects.

According to an embodiment of a fifth aspect of the present invention, there in provided integrated circuitry such as an IC chip comprising any of the transformer circuitries or the amplifier circuitry or the oscillator circuitry as claimed in claim 19.

Reference will now be made, by way of example, to the accompanying drawings, of which:

FIG. 1, considered above, is a schematic diagram of a resistive-load amplifier;

FIG. 2, considered above, is a schematic diagram of an inductive-load amplifier;

FIG. 3 is a schematic diagram of transformer circuitry 100 embodying the present invention, which may be used to replace the inductor L of the conventional inductive-load amplifier 20, illustrated in FIG. 2, in order to increase frequency tuning range.

Figure 1:
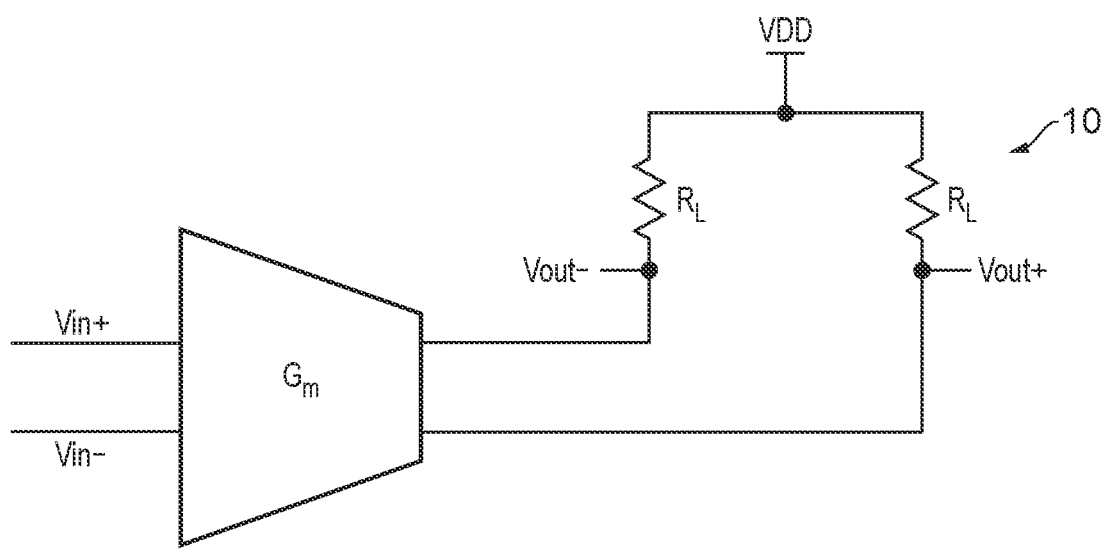
Figure 2:
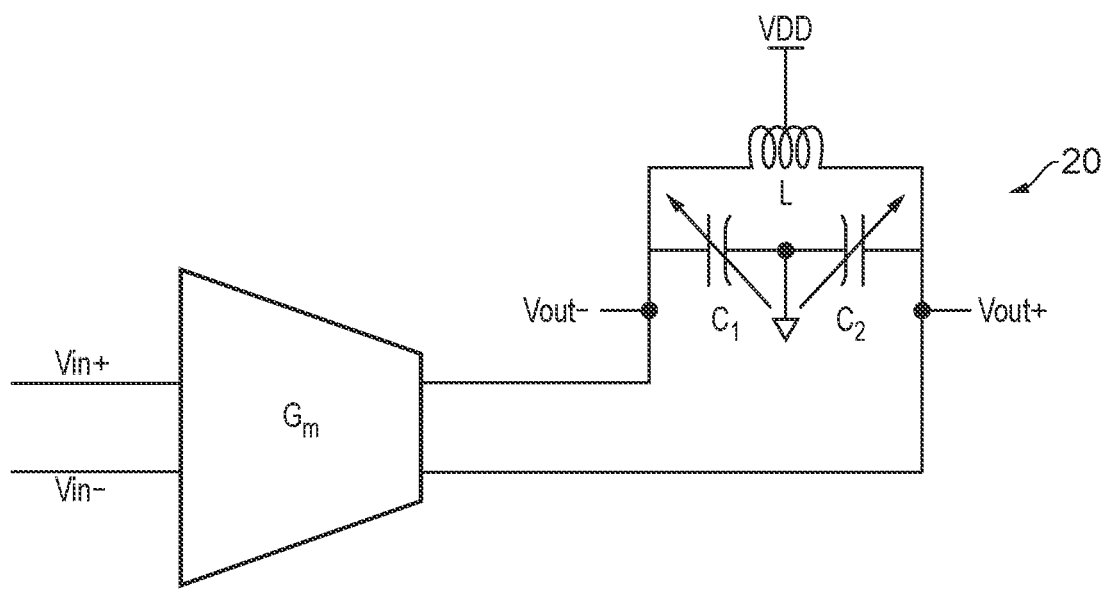

Transformer circuitry 100 comprises a primary coil 110 magnetically coupled to a secondary coil 120, forming a transformer. Although the primary and secondary coils 110, 120 may be coupled by a magnetic core such as, for example, silicon steel or solid iron, air coupling is also possible such that the magnetic coupling is facilitated through the permeability of air in free space. In the case of integrated circuitry implemented on an IC chip (being a focus of the present invention), the primary and secondary coils 110, 120 may for example be implemented in adjacent metal layers of the IC chip with dielectric layers therebetween.

A switch 140 connected to the secondary coil 120 is operable in an open position, in which the inductance measured between output terminals Vout+ and Vout− becomes effectively $L_1$. The switch 140 is also operable in a closed position, in which the inductance measured between output terminals Vout+ and Vout− includes the effect of $L_1$ and $L_2$ (as explained in more detail later herein).

A primary coil driver 130 is connected to the primary coil 110 to generate or drive a primary voltage across the primary coil 110. The voltage generated across the primary coil 110 is output from output terminals Vout+ and Vin+ and has an AC component (and may be an AC signal). According to some embodiments of the present invention, the primary coil driver 130 may be configured such that the transformer circuitry 100 is, for example, amplifier circuitry or oscillator circuitry.

Figure 4:
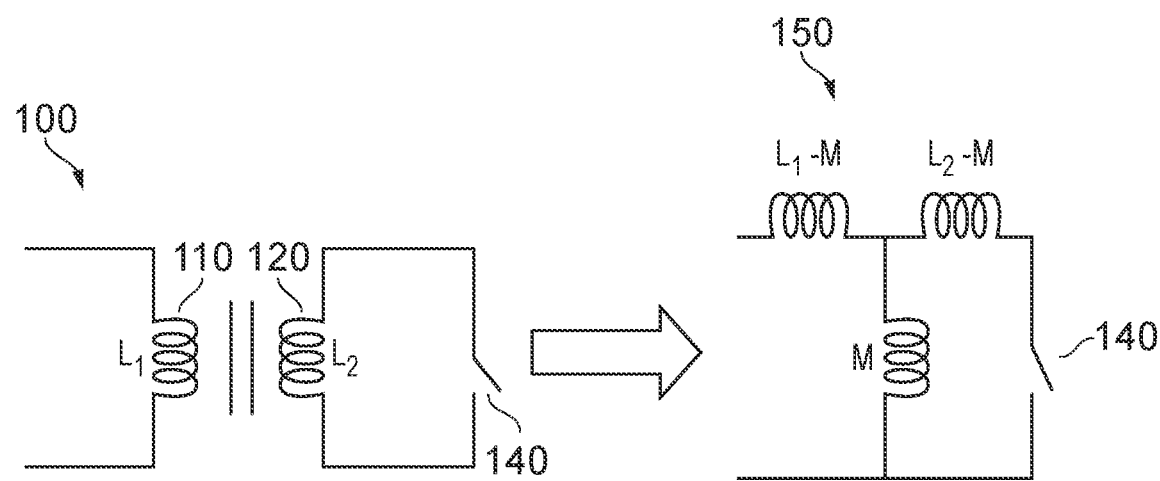
FIG. 4 is a schematic diagram presenting an equivalent circuit of part of the transformer circuitry illustrated in FIG. 3.

In order to assist in explaining the transformer circuitry 100 operation, an equivalent circuit 150 of part of the transformer circuitry 100 is provided in FIG. 4 alongside the relevant part of the transformer circuitry 100. The equivalent circuit 150 illustrates the equivalent inductances of the transformer circuitry 100 in the form of $L_1-M$, $L_2-M$ and M, where $L_1$ represents the primary coil inductance, $L_2$ represents the secondary coil inductance and M represents the mutual inductance of the primary and secondary coils.

When the switch 140 is open (i.e. the switch is turned OFF), the equivalent inductance of the transformer part of the transformer circuitry 100 is $(L_1-M)+M=L_1$. When the switch 140 is closed (i.e. the switch is turned ON), the equivalent inductance of the transformer 100 becomes $$(L_1 - M) + \left(\frac{M \cdot (L_2 - M)}{L_2}\right),$$

which is smaller than $L_1$. This change in inductance provides two centre frequencies of operation with wide separation at which an output voltage signal can be generated and output from output terminals Vout+ and Vout− (see FIG. 3). In embodiments where the transformer circuitry 100 is amplifier circuitry, the switch 140 provides a means for the amplifier to operate at two different frequency bands rather than just one.

Although the introduction of the switch 140 to the secondary coil 120 provides two spot frequencies of operation, and thereby introduces an additional frequency band of operation, there remains a desire for a continuous frequency tuning range for a transformer. Furthermore, the Q-factor of the transformer's 100 equivalent inductance is reduced due to the parasitic effects introduced by the switching of switch 140 (i.e. by the ON resistance of switch 140).

Figure 5:
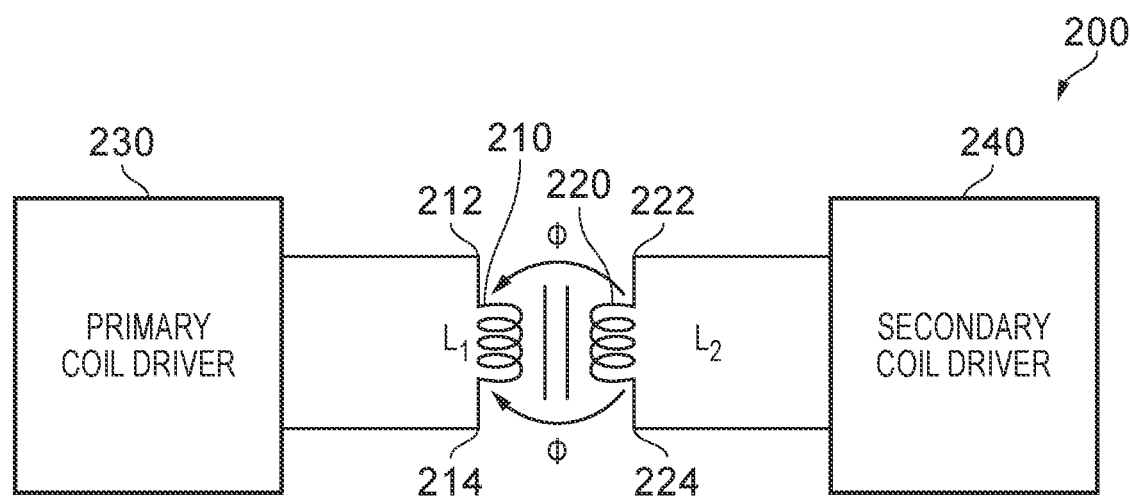
FIG. 5 is a schematic diagram of further transformer circuitry embodying the present invention.

According to embodiments of the present invention, continuous frequency tuning may be achieved for a transformer by replacing the switch 140 of transformer 100 with a secondary coil driver 240, as illustrated in FIG. 5.

FIG. 5 is a schematic diagram of transformer circuitry 200 embodying the present invention. Transformer circuitry 200 comprises a primary coil 210 connected to a primary coil driver 230 via first and second primary coil terminals 212, 214, and a secondary coil 220 connected to a secondary coil driver 240 via first and second secondary coil terminals 222, 224. As before, the primary and secondary coils 210, 220 are coupled to form a transformer.

The primary coil driver 230 may be considered part of the transformer circuitry 200 as indicated in FIG. 5. However, the transformer circuitry 200 may in some arrangements be considered to comprise the elements of FIG. 5 other than the primary coil driver 230 and be provided for connection to the primary coil driver 230. The present disclosure, including the other embodiments disclosed later, will be understood accordingly. Indeed, similar considerations also apply to FIG. 3.

The primary coil driver 230 is configured to drive a primary voltage signal V1 (an AC voltage signal or a voltage signal with an AC component) across the first and second primary terminals 212, 214 of the primary coil 210 such that a primary current i1 flows through the primary coil 210.

The secondary coil driver 240 is configured to drive a secondary voltage signal V2 (an AC voltage signal or a voltage signal with an AC component) across the first and second secondary terminals 222, 224 of the secondary coil 220, which has a target relationship with the primary voltage signal V1.

For ease of explanation, it will be assumed that the secondary coil driver 240 drives the secondary voltage signal V2 such that it is substantially proportional to the primary voltage signal V1. For example, it may be that V2∝V1×S, or V2=V1×S, where S is a scaling factor.

As a result, a secondary current i2 flows through the secondary coil 220 that is proportional to the primary voltage signal V1, which in turn generates magnetic flux that generates a scaled version αV1 of the primary voltage signal V1 at the primary coil 210 (as a back EMF), where α is also a scaling factor.

Figure 6:
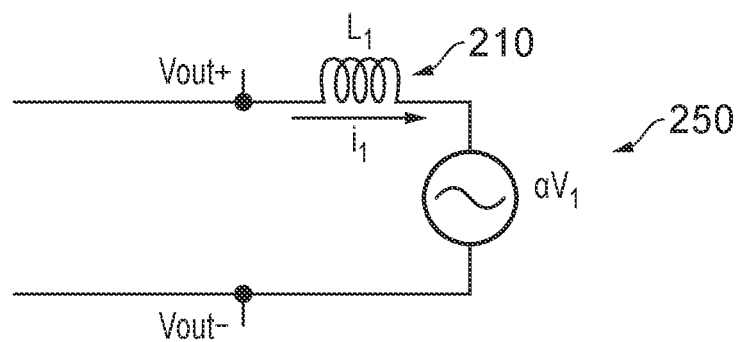
FIG. 6 is a schematic diagram of an equivalent circuit corresponding to the transformer circuitry illustrated in FIG. 5.

FIG. 6 is a schematic diagram showing an equivalent circuit 250 which represents the transformer circuitry 200 but with the primary coil driver 230 not shown. The effect of the secondary coil driver 240 is shown by virtue of the back EMF αV1 shown effectively in series with the primary coil 210. The terminals Vout+ and Vout− in FIG. 6 correspond to the terminals 212 and 214 in FIG. 5, respectively. In FIG. 6, $L_1$ is the inductance of the primary coil 210, $i_1$ is the primary current flowing through the primary coil 210, and $V_1$ is the primary voltage signal V1.

The effect of the secondary coil driver 240 will be considered firstly by considering the inductor equation (1) below assuming that the secondary coil driver 240 is not present so that the back EMF αV1 is also not present:

$$V_1 = L_1 \cdot \frac{di_1}{dt}, \quad (1)$$

Now, introducing the effect of the secondary coil driver 240 and thus also the back EMF αV1, it follows that if the voltage signal experienced at the primary coil 210 is changed from $V_1$ to $V_1-\alpha V_1$, i.e. scaled by 1−α, then the current $i_1$ (or its rate of change) is also scaled by 1−α. Moreover, as also apparent from a consideration of equation (1), this scaling of the current $i_1$ (or its rate of change) by 1−α in a coil which is actually driven by the primary voltage signal V1 is equivalent to a scaling of the inductance $L_1$ by 1/(1−α) so that the effective inductance $L_E$ of the primary coil 210 (due to the effect of the back EMF from the secondary coil 220) becomes:

$$L_E = \frac{L_1}{(1-\alpha)} \quad (2)$$

Thus, by varying the scaling factor α the effective inductance $L_E$ can be varied according to equation (2), which enables e.g. the resonant frequency/frequency response of the transformer circuitry 200 to be varied (tuned) for example where it is implemented as oscillator circuitry or amplifier circuitry as mentioned earlier.

In the present example, the scaling factor α is dependent on the scaling factor S. That is, S is the scaling factor applied to the primary voltage signal V1 to get the secondary voltage signal V2 which is applied to the secondary coil 220, and α is the overall scaling factor of the back EMF. In embodiments where the transformer 200 does not have a turns ratio of 1:1, the scaling factor S and the scaling factor α may not be equal.

It follows from the above (see equation (2)) that the relationship between V2 and V1 (i.e. scaling factor S) can be varied or controlled to vary or control the effective inductance $L_E$ of the primary coil 210. This opens up the possibility to control the effective inductance $L_E$ to the same resolution that S and thus α can also be varied, for example enabling a range of many discrete values or even a continuous range of values.

Figure 3:
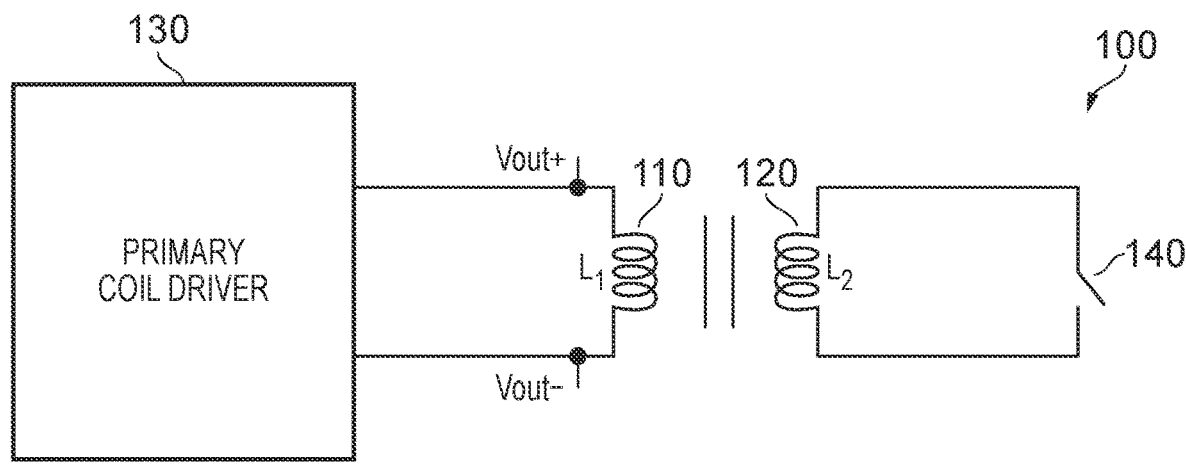
FIG. 3 is a schematic diagram of transformer circuitry embodying the present invention.

Furthermore, replacing the switch 140 in transformer 100 of FIG. 3 with the secondary coil driver 240 in transformer 200 of FIG. 5 removes the detrimental effect on Q-factor of the ON resistance of switch 140. This provides the advantage of an increased frequency tuning range without determinately affecting the Q-factor of the transformer's equivalent inductance.

Figure 7:
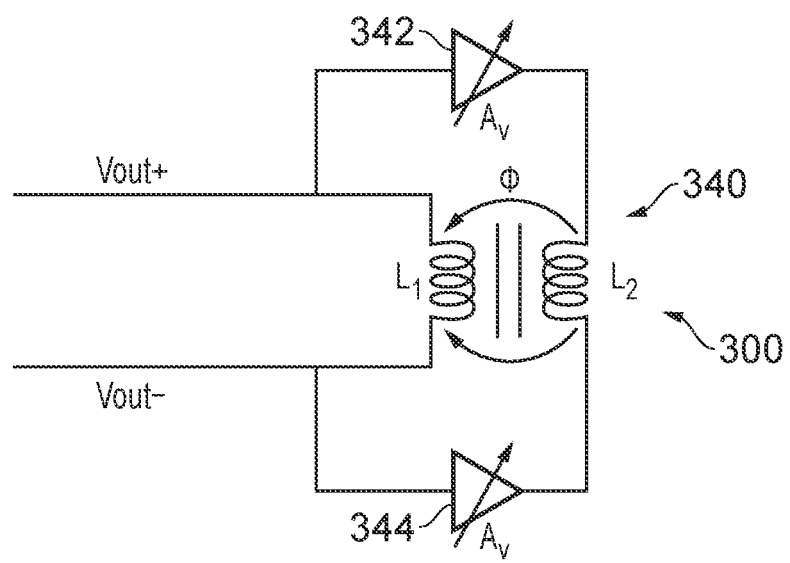
FIG. 7 is a schematic diagram of further transformer circuitry embodying the present invention.

FIG. 7 is a schematic diagram illustrating transformer circuitry 300 embodying the present invention. Transformer circuitry 300 comprises primary and secondary coils configured to operate in the same way as primary and secondary coils 210, 220 of transformer circuitry 200. As with transformer circuitry 200 of FIG. 5, transformer circuitry 300 illustrated in FIG. 6 is driven by a primary coil driver (not shown). The difference between the two sets of transformer circuitry illustrated in FIGS. 5 and 7 is that the secondary coil driver 240 of transformer circuitry 200 is implemented in the form of a (e.g. programmable or controllable) amplifier 340 in transformer circuitry 300.

The amplifier 340 is electrically connected between the primary coil and the secondary coil such that the primary voltage signal V1 is fed from the primary coil to the secondary coil via the amplifier 340. For example, a first input terminal of the amplifier 340 may be connected to the first primary terminal and a corresponding output terminal to the first secondary terminal. Similarly, a second input terminal of the amplifier 340 may be connected to the second primary terminal and a corresponding output terminal the second secondary terminal.

The amplifier 340 is configured to amplify the primary voltage signal V1 by an amplification factor A in order to generate the secondary AC voltage signal used to drive the secondary coil, so that V2∝V1×A or V2=V1×A, where A is an amplification factor.

As discussed above, a secondary current i2 flows through the secondary coil that is proportional to the primary voltage signal V1, which in turn generates magnetic flux that generates a scaled version αV1 of the primary voltage signal V1 at the primary coil 210 (as a back EMF), where a is a scaling factor (reusing the variable a here for simplicity of explanation). It therefore follows as above that the effective inductance $L_E$ of the primary coil (due to the effect of the back EMF from the secondary coil) becomes controllable according to equation (2) above. Thus, the effective inductance $L_E$ of the primary coil can be controlled or varied by controlling the amplification factor A in a similar way as for controlling the scaling factor S in relation to FIG. 5, and the considerations above in relation to FIG. 5 apply here mutatis mutandis so that duplicate description may be omitted.

The scaling factor α may be adjusted by controlling the amplification factor A (e.g. over a continuous range or over discrete values) based on an input signal received by the amplifier 340 for example where it is a programmable amplifier. Such an input signal may be received from an external source, such as an external controller.

The amplifier 340 may be an amplifier module electrically connected between the primary and secondary coils. Alternatively, the programmable amplifier may comprise first and second sub-amplifies 342, 344. The first sub-amplifier 342 may be electrically connected between the first primary terminal and the first secondary terminal and be configured to amplify a first component of the primary voltage signal V1. The second sub-amplifier 344 may be electrically connected between the second primary terminal and the second secondary terminal and be configured to amplify a second component of the primary voltage signal V1. The first and second signal components may be, for example, positive and negative components of the primary voltage signal V1.

Figure 8:
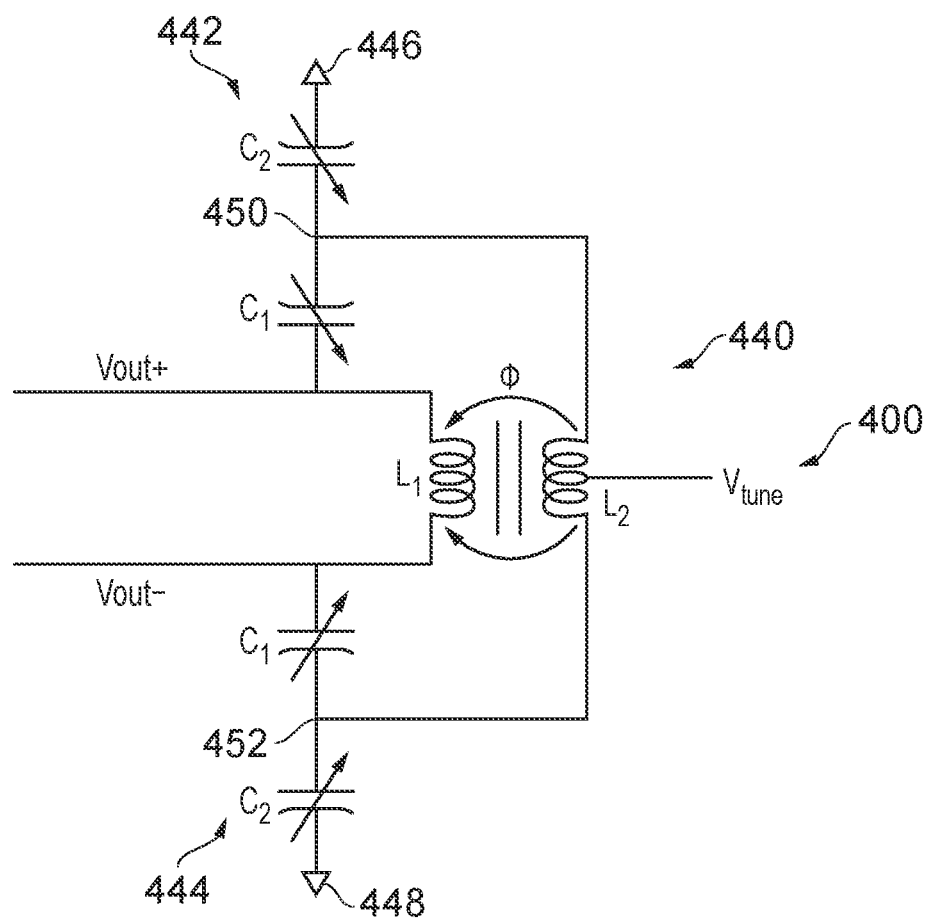
FIG. 8 is a schematic diagram of further transformer circuitry embodying the present invention.
Figure 9:
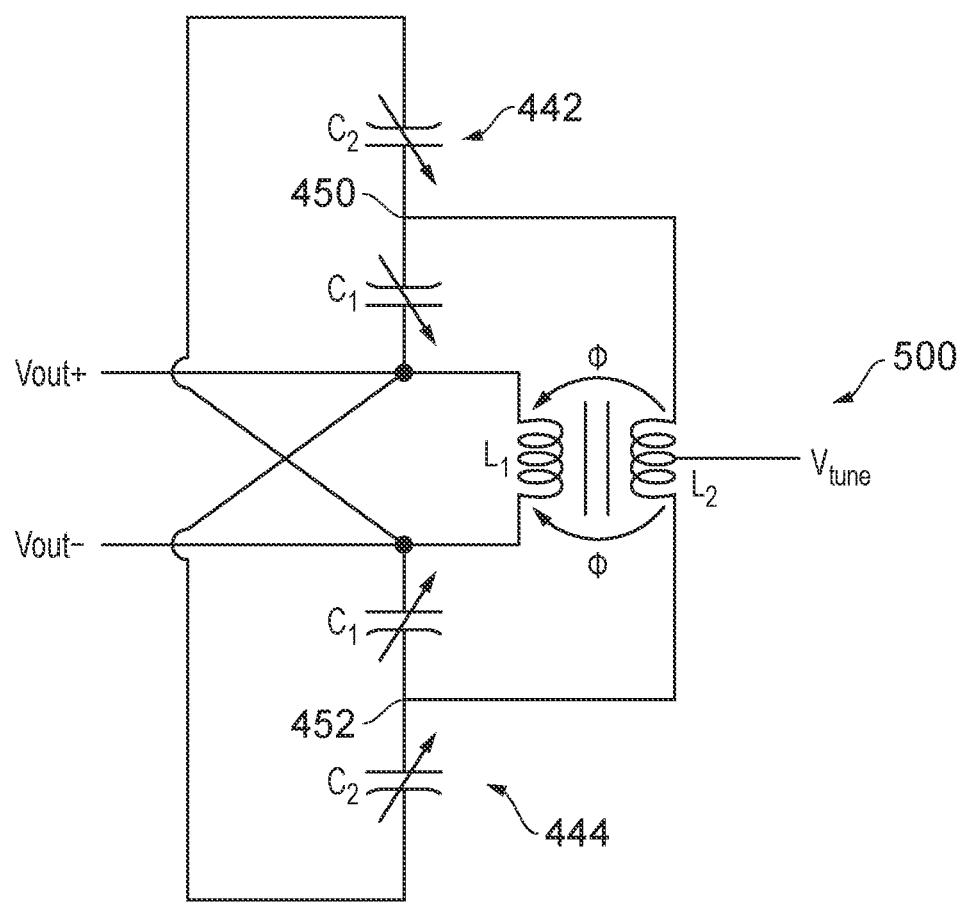
FIG. 9 is a schematic diagram of further transformer circuitry embodying the present invention.

In other embodiments of the present invention the amplifier 340 may be replaced with a capacitor bank or network in order to implement voltage scaling. FIGS. 8 and 9, discussed below, illustrate embodiments in which frequency tuning is performed with capacitors instead of an amplifier.

FIG. 8 is a schematic diagram of transformer circuitry 400 in which the amplifier 340 of FIG. 7 is replaced with a capacitor network 440. The capacitor network 440 may be considered an example of a passive impedance network (e.g. which may comprise R, L and/or C components), and the present embodiment will be understood accordingly as an example.

The transformer circuitry 400 comprises primary and secondary coils configured to operate in the same way as primary and secondary coils 210, 220 of transformer 200. As with transformer circuitry 200 of FIG. 5, transformer circuitry 400 illustrated in FIG. 8 is driven by a primary coil driver (not shown). It will also become apparent that in the present embodiment the secondary coil driver is implemented as the primary coil driver and the capacitor network 440 in combination.

The capacitor network 440 is electrically connected between the primary coil and the secondary coil such that the primary voltage signal V1 is fed from the primary coil to the secondary coil via the capacitor network 440. For example, a first input terminal of the capacitor network 440 may be connected to the first primary terminal and a corresponding output terminal to the first secondary terminal. Similarly, a second input terminal of the capacitor network 440 may be connected to the second primary terminal and a corresponding output terminal to the second secondary terminal.

The capacitor network 440 is configured to scale the primary voltage signal V1 by a scaling factor S in order to generate the secondary voltage signal V2 used to drive the secondary coil, so that V2∝V1×S, or V2=V1×S, where S is a scaling factor.

As discussed above, a secondary current i2 flows through the secondary coil that is proportional to the primary voltage signal V1 . . . which in turn generates magnetic flux that generates a scaled version αV1 of the primary voltage signal V1 at the primary coil 210 (as a back EMF), where a is a scaling factor (reusing the variable a here for simplicity of explanation) which is dependent on the scaling factor S. It therefore follows as above that the effective inductance $L_E$ of the primary coil (due to the effect of the back EMF from the secondary coil) becomes controllable according to equation (2) above. Thus, the effective inductance $L_E$ of the primary coil can be controlled or varied by controlling the scaling factor S as in FIG. 5, and the considerations above in relation to FIG. 5 apply here too.

The scaling factor α may be adjusted by controlling the scaling factor S (e.g. over a continuous range or over discrete values) based on an input signal e.g. received from an external source, such as an external controller. Such a control signal may for example control or program certain capacitors within the capacitor network 440 to thereby adjust the scaling factor S.

For example, one or more of the capacitors in the capacitor network 440 may be variable capacitors or varactors controlled by respective control signals, in which each of the one or more variable capacitors are configured to vary their capacitance and thereby the effect of the capacitor network 440. The one or more variable capacitors or varactors may be referred to as programmable capacitors.

In the case of varactors, a tuning voltage $V_{tune}$ applied at a centre tap between the first and second secondary terminals of the secondary coil as shown in FIG. 8 may be controlled to control the capacitance values. In certain embodiments, switched capacitors may be used in the capacitor network 440, wherein the switched capacitors are programmed to be switched on or off (into or out of circuit) using at least one control signal. The switched capacitors may have fixed capacitance values or may have variable capacitance values. Advantageously, using fixed capacitance capacitors provides for simpler circuit integration and reduced tuning range degradation. Where switched capacitors are used instead of varactors, $V_{tune}$ can be connected to a fixed voltage potential.

In certain embodiments of the present invention, the capacitor network 440 may comprise first and second capacitive potential dividers 442, 444. Each of the capacitive potential dividers 442, 444 may comprise first and second capacitors $C_1$, $C_2$ connected in series.

The first and second capacitors $C_1$, $C_2$ of the first capacitive potential divider 442 may be connected such that the second capacitor $C_2$ is connected between a first voltage source 446 (e.g. ground supply, GND) and a first intermediate node 450, and the first capacitor $C_1$ is connected between the first intermediate node 450 and the first primary terminal. The first intermediate node 450 of the first capacitive potential dividers 442 may be connected to the first secondary terminal of the secondary coil such that the voltage generated at the first secondary terminal is a scaled version of the voltage generated at the first primary terminal.

The first and second capacitors $C_1$, $C_2$ of the second capacitive potential divider 444 may be connected such that the second capacitor $C_2$ is connected between a second voltage source 448 (e.g. ground supply, GND) and a second intermediate node 452, and the first capacitor $C_1$ is connected between the second intermediate node 452 and the second primary terminal. The second intermediate node 452 of the second capacitive potential divider 444 may be connected to the second secondary terminal of the secondary coil such that the voltage generated at the second secondary terminal is a scaled version of the voltage generated at the second primary terminal.

The scaling factor S of transformer circuitry 400 may be controlled by the capacitor network 440 and/or the first and second capacitive potential dividers 442, 444 to obtain S (or α) values of 0 to 1 according to the voltage drop (or potential divider effect) generated.

For example, considering a range of capacitance values between a minimum value (in an ideal case, zero capacitance) and a maximum value (in an ideal case, infinite capacitance), the minimum value may approximate an open circuit connection and the maximum value may approximate a short circuit connection. With this in mind, and looking at FIG. 8, by setting both first capacitors $C_1$, $C_1$ of the first and second capacitive potential dividers 442, 444 to their maximum values and setting both second capacitors $C_2$, $C_2$ of the first and second capacitive potential dividers 442, 444 to their minimum values, the majority of the primary voltage signal V1 (i.e. the primary voltage signal V1 minus the voltage drops across first capacitors $C_1$, $C_1$) is applied across the secondary coil, which corresponds to S (or α) values of (close to) 1. S (or α) values of (close to) 0 may be obtained by setting both second capacitors $C_2$, $C_2$ of the first and second capacitive potential dividers 442, 444 to their maximum values and setting both first capacitors $C_1$, $C_1$ of the first and second capacitive potential dividers 442, 444 to their minimum values. In this way, the secondary coil is connected to the first and second voltage sources 446, 448 via the second capacitors $C_2$, $C_2$ so that the secondary coil effectively has a DC voltage signal at both of its terminals. As shown in FIG. 8, in the present embodiment the first and second voltage sources 446, 448 are ground terminals.

As above, it will be appreciated that the scaling factor S (or α) may be controlled to be any value between (close to) 0 and 1 dependent on the resolution of the capacitance values.

In certain embodiments, the first capacitors $C_1$, $C_1$ of the first and second capacitive potential dividers 442, 444 have equal capacitances, and the second capacitors $C_2$, $C_2$ similarly have equal capacitances.

In other embodiments of the present invention, the scaling factor S (or α) may be controlled to vary between (close to) −1 and +1 in order to provide a further increased frequency tuning range. FIG. 9 is a schematic diagram illustrating transformer circuitry 500 which is the same as transformer circuitry 400 except that the first and second capacitive potential dividers 442, 444 are connected in an alternative configuration in order to obtain a scaling factor S (or α) of (close to) −1 to +1.

In particular, the difference between the transformer circuitry 500 and the transformer circuitry 400 is that for the first capacitive potential divider 442 the second capacitor $C_2$ is connected between the first intermediate node 450 and the second primary terminal, and for the second capacitive potential divider 444 the second capacitor $C_2$ is connected between the second intermediate node 452 and the first primary terminal. Otherwise, the transformer circuitry 500 and the transformer circuitry 400 are the same as one another and duplicate description may be omitted.

Considering again a range of capacitance values between a minimum value (in an ideal case, zero capacitance) and a maximum value (in an ideal case, infinite capacitance), the minimum value may approximate an open circuit connection and the maximum value may approximate a short circuit connection. With this in mind, and looking at FIG. 9, by setting both first capacitors $C_1$, $C_1$ of the first and second capacitive potential dividers 442, 444 to their maximum values and setting both second capacitors $C_2$, $C_2$ of the first and second capacitive potential dividers 442, 444 to their minimum values, the majority of the primary voltage signal V1 (i.e. the primary voltage signal V1 minus the voltage drops across first capacitors $C_1$, $C_1$) is applied across the secondary coil, which corresponds to S (or α) values of (close to)+1. S (or α) values of (close to) −1 may be obtained by setting both second capacitors $C_2$, $C_2$ of the first and second capacitive potential dividers 442, 444 to their maximum values and setting both first capacitors $C_1$, $C_1$ of the first and second capacitive potential dividers 442, 444 to their minimum values, since in this way the majority of the primary voltage signal V1 (i.e. the primary voltage signal V1 minus the voltage drops across first capacitors $C_2$, $C_2$) is applied across the secondary coil but with inverted polarity.

It will be appreciated that the scaling factor S (or α) may be controlled to be any value between (close to) −1 and +1 dependent on the resolution of the capacitance values. Advantageously, by providing a scaling factor S (or α) that can be controlled between a range of (close to) −1 to +1, the frequency tuning range is further increased for the transformer circuitry 500 as compared to transformer circuitry 400.

The use of capacitors as in FIGS. 8 and 9 instead of using an amplifier as in FIG. 7 provides further advantages. In particular, the additional current required to operate an amplifier is not necessary for controlling capacitors, and therefore transformer circuitry 400 and 500 consume less power and are more efficient than transformer circuitry 300. Furthermore, an amplifier includes active components such as transistors (e.g. BJTs or FETs such as MOSFETs) which may introduce additional noise to the transformer circuitry 300 as compared to transformer circuitry 400 and 500. By replacing transistors with capacitors, transformer circuitry 400 and 500 provide improved noise performance.

Figure 10:
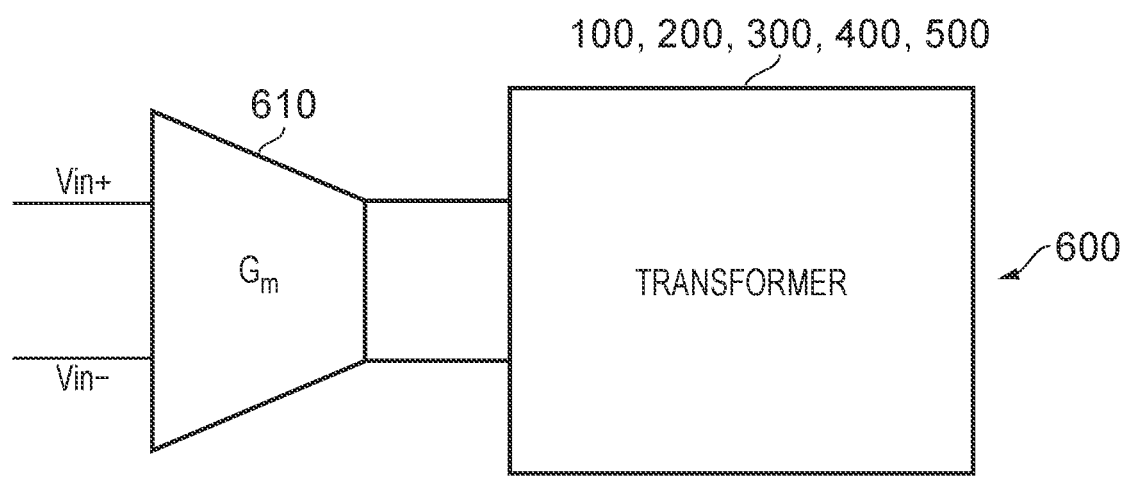
FIG. 10 is a schematic diagram of further transformer circuitry embodying the present invention.
Figure 11:
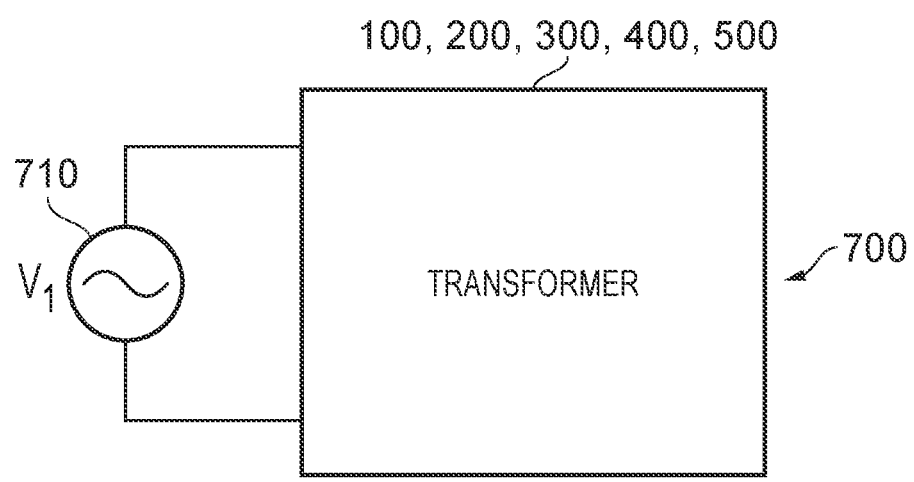
FIG. 11 is a schematic diagram of further transformer circuitry embodying the present invention.

As discussed above, the primary coil driver of transformer circuitry 100, 200, 300, 400 and 500 may be configured so that the overall transformer circuitry constitutes an amplifier or an oscillator. FIG. 10 is a schematic diagram illustrating transformer circuitry 600 in which the primary coil driver is the relevant portion 610 of a transconductance amplifier so that the transformer circuitry 600 as a whole constitutes a transconductance amplifier. Similarly, FIG. 11 is a schematic diagram illustrating transformer circuitry 700 in which the primary coil driver is the relevant portion 710 of a voltage controlled oscillator (VCO) so that the transformer circuitry 700 as a whole constitutes a VCO.

Figure 12:
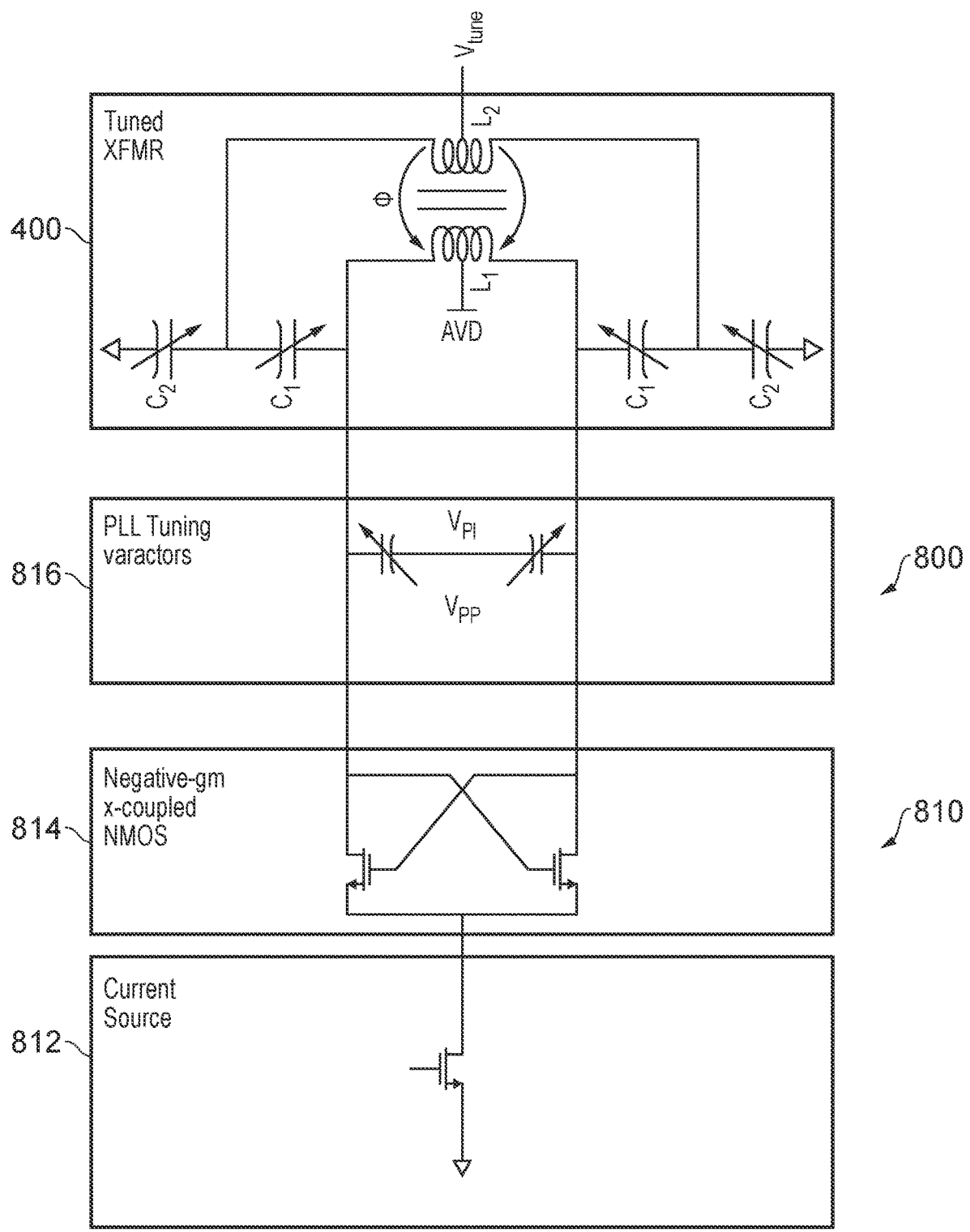
FIG. 12 is a schematic diagram of a voltage controlled oscillator in which a transformer embodying the present invention in incorporated.

FIG. 12 is a schematic diagram illustrating circuitry 800 constituting a detailed example of a VCO, in which the transformer circuitry 400 of FIG. 8 is used to tune the resonant frequency or the frequency of operation (and thus of the VCO output signals). The elements 810 of the VCO 800, comprising elements 812, 814 and 816 may be considered together to correspond to a primary coil driver with respect to the transformer circuitry 400.

The VCO 800 comprises a current source 812, negative-gm cross-coupled NMOS transistors 814, and tuning varactors 816. The tuning varactors 816 may be referred to as PLL (phase locked loop) varactors as indicated, where the VCO 800 is for example intended for use as the VCO of a PLL.

The cross-coupled NMOS transistors 814 may alternatively be implemented using PMOS transistors, or a mix of PMOS and NMOS transistors, in other VCO circuit topologies as will be known to the skilled person. The VCO current bias may be top-biased or tail-biased. Further, the current source 812 may be replaced by a resistor or completely removed from the VCO 800. In order to reduce circuit noise, an LC noise filter, an extra capacitor bank and/or extra varactors can be included in the VCO 800. Transformer circuitry 400 operates as discussed above in relation to FIG. 8 in order to generate a variable inductance between the first and second primary terminals such that the frequency of the VCO output signal may be controlled.

It will be appreciated that any of the transformer circuitry 100, 200, 300, 400 and 500 embodying the present invention could be provided as part of a VCO, for example as part of mixed-signal circuitry such as DAC or ADC circuitry.

Figure 13:
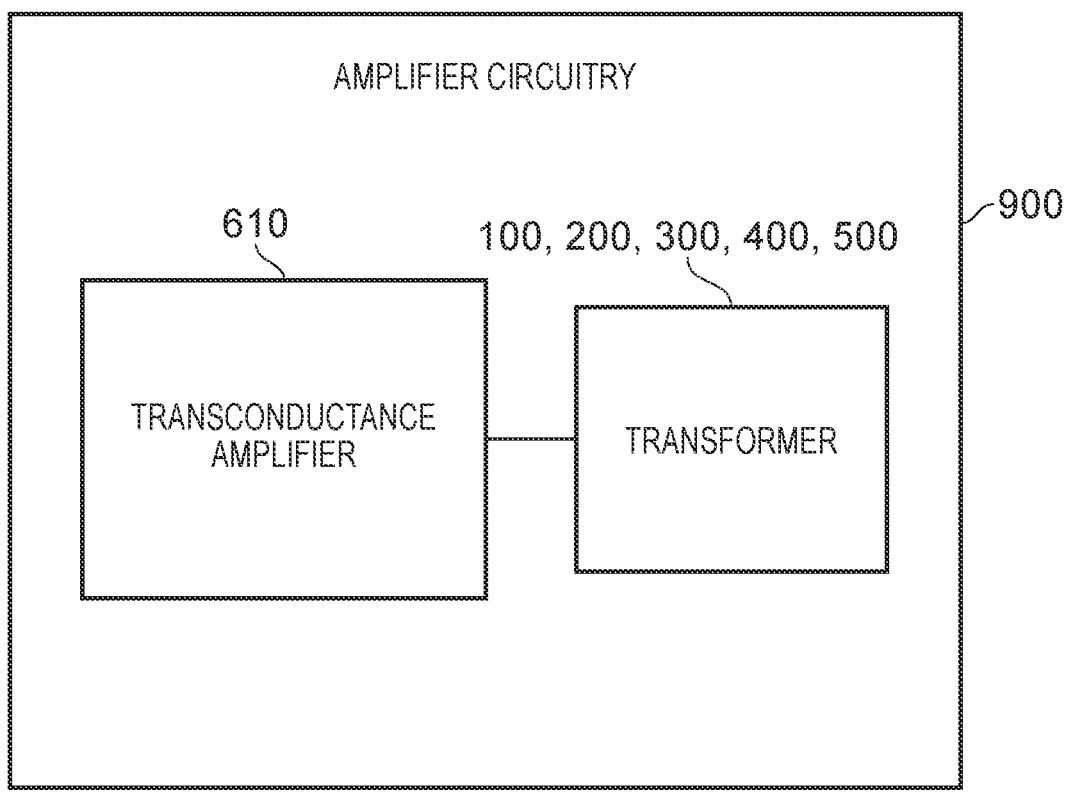
FIG. 13 is a schematic diagram of integrated amplifier circuitry in which a transformer embodying the present invention is incorporated.
Figure 14:
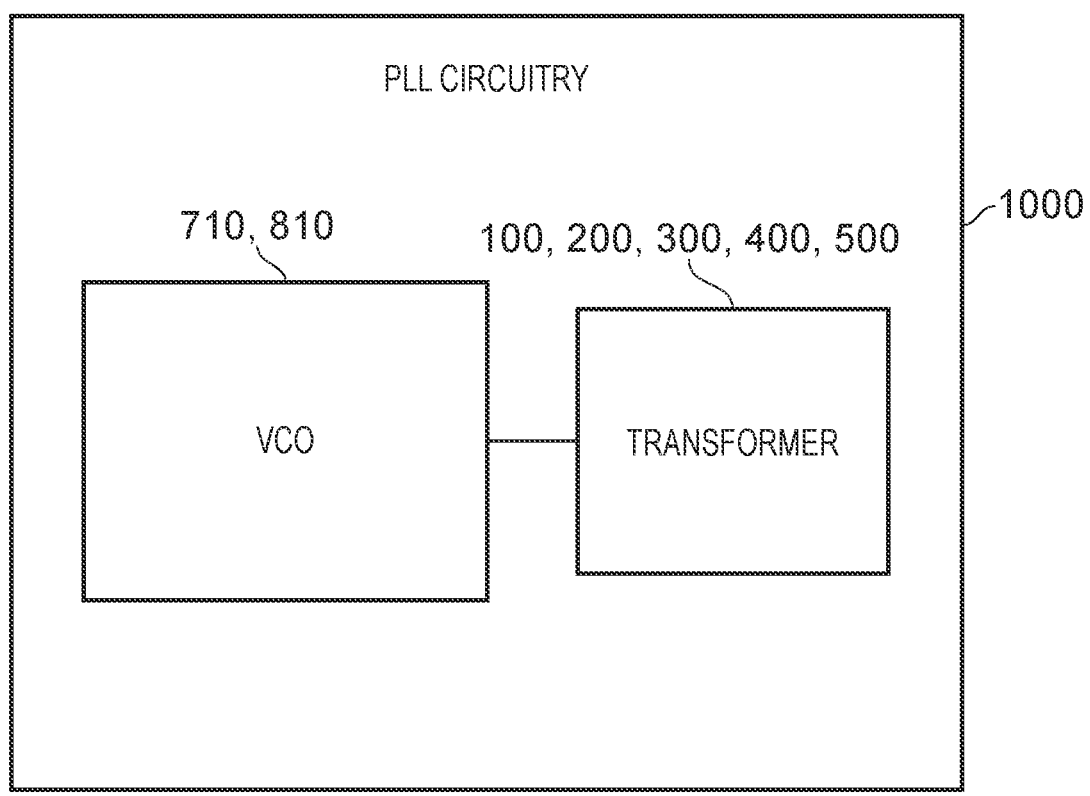
FIG. 14 is a schematic diagram of integrated phase locked loop circuitry in which a transformer embodying the present invention is incorporated.
Figure 15:
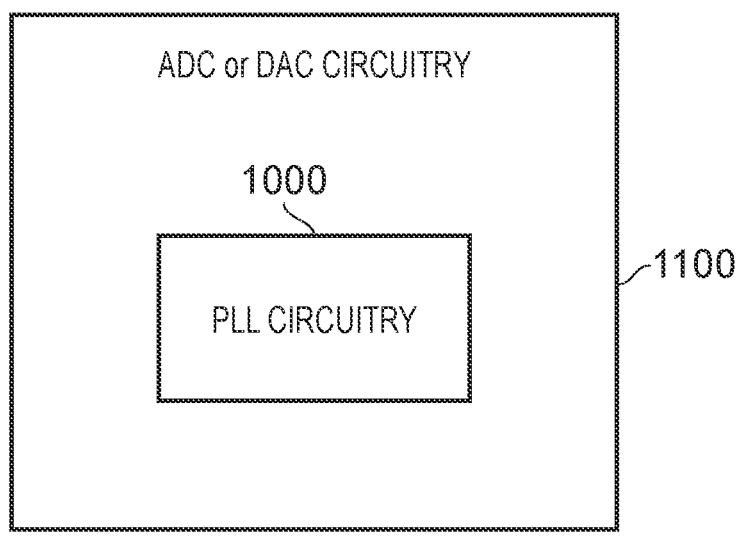
FIG. 15 is a schematic diagram of integrated ADC or DAC circuitry in which a transformer embodying the phase locked loop of FIG. 14 is incorporated.

It will be appreciated that any of the transformer circuitry 100, 200, 300, 400, 500, 600 and 700 embodying the present invention may be implemented as integrated circuitry, for example on an IC chip such as flip chip. The present invention extends to integrated circuitry and IC chips as mentioned above, circuit boards comprising such IC chips, and communication networks (for example, internet fiber-optic networks and wireless networks) and network equipment of such networks, comprising such circuit boards. In particular, FIG. 13 illustrates amplifier circuitry 900 implemented as integrated circuitry 900. The amplifier circuitry 900 comprises the relevant parts 610 of a transconductance amplifier which act as a primary coil driver for any of transformers 100, 200, 300, 400 or 500 so that the overall circuitry 900 is a transconductance amplifier. FIG. 14 illustrates PLL circuitry 1000 implemented as integrated circuitry 1000. The PLL circuitry 1000 comprises circuitry 710, 810 which acts as a primary coil driver for any of transformer circuitry 100, 200, 300, 400 and 500. FIG. 15 illustrates ADC or DAC circuitry 1100 implemented as integrated circuitry 1100. The ADC or DAC circuitry 1100 comprises the PLL circuitry 1000 of FIG. 14.

The present invention may be embodied in many different ways in the light of the above disclosure, within the spirit and scope of the appended claims.

The invention claimed is:

1. A transformer circuitry, comprising:
a transformer having a primary coil and a secondary coil, the primary coil having first and second primary terminals and the secondary coil having first and second secondary terminals; and
a secondary coil driver configured to drive a secondary voltage signal V2 across the secondary terminals which has a target relationship with a primary voltage signal V1 driven across the primary terminals by a primary coil driver so that an inductance value measured between the primary terminals is governed by the target relationship, wherein
the secondary coil driver is implemented as the primary coil driver and a capacitor network connected between the primary coil and the secondary coil, the capacitor network is configured to apply a scaled version of the primary voltage signal V1 to the secondary coil as the secondary voltage signal so that the target relationship is $V2 \propto V1 \times S$, where S is a scaling factor, and
the capacitor network comprises programmable capacitors, and wherein the secondary coil driver is configured to control the scaling factor S based on a control voltage applied to the programmable capacitors to control the target relationship.

2. The transformer circuitry according to claim 1, wherein the target relationship is that the secondary voltage signal V2 is substantially proportional to the primary voltage signal V1.

3. The transformer circuitry according to claim 1, wherein the secondary coil driver is configured to control the driven secondary voltage signal V2 based on the primary voltage signal V1to maintain the target relationship.

4. The transformer circuitry according to claim 1, wherein the secondary coil driver comprises an amplifier connected between the primary coil and the secondary coil, the amplifier configured to generate the secondary voltage signal V2 based on the primary voltage signal V1 so that the target relationship is $V2 \propto V1 \times A$, where A is an amplification factor.

5. The transformer circuitry according to claim 4, wherein the amplifier comprises first and second sub-amplifiers, the first sub-amplifier connected between the first primary terminal and the first secondary terminal, and the second sub-amplifier connected between the second primary terminal and the second secondary terminal.

6. The transformer circuitry according to claim 1, wherein the capacitor network comprises first and second capacitive potential dividers, the first capacitive potential divider connected so that a voltage signal applied at the first secondary terminal is dependent on a voltage signal applied at the first primary terminal, and the second capacitive potential divider connected so that a voltage signal applied at the second secondary terminal is dependent on a voltage signal applied at the second primary terminal.

7. The transformer circuitry according to claim 6, wherein:
each of the capacitive potential dividers comprises first and second capacitors connected together in series, so that the first capacitor of each capacitive potential divider is connected between a first node and an intermediate node of that potential divider, and the second capacitor of each capacitive potential divider is connected between the intermediate node and a second node of that potential divider;
for the first capacitive potential divider, the first node is connected to the first primary terminal and the intermediate node is connected to the first secondary terminal; and
for the second capacitive potential divider, the first node is connected to the second primary terminal and the intermediate node is connected to the second secondary terminal.

8. The transformer circuitry according to claim 7, wherein:
for the first and second capacitive potential dividers, the second node is connected to a voltage source node.

9. The transformer circuitry according to claim 7, wherein:
for the first capacitive potential divider, the second node is connected to the second primary terminal; and
for the second capacitive potential divider, the second node is connected to the first primary terminal.

10. The transformer circuitry according to claim 6, wherein:
when at least one capacitor of the at least one of the first and second capacitive potential dividers is a variable capacitor, the secondary coil driver is configured to control a capacitance value of the at least one variable capacitor based on a control signal to control the target relationship; and when at least one capacitor of the at least one of the first and second capacitive potential dividers is a varactor, the secondary coil driver is configured to control a tuning voltage applied to the secondary coil based on a control signal to control the target relationship.

11. An amplifier circuit comprising the transformer circuitry according to claim 1.

12. An integrated circuit comprising the transformer circuitry according to claim 1.

13. A transformer circuitry, comprising:

a transformer having a primary coil and a secondary coil, the primary coil having first and second primary terminals and the secondary coil having first and second secondary terminals; and a secondary coil driver configured to drive a secondary voltage signal V2 across the secondary terminals which has a target relationship with a primary voltage signal V1 driven across the primary terminals by a primary coil driver so that an inductance value measured between the primary terminals is governed by the target relationship, wherein the secondary coil driver comprises an amplifier connected between the primary coil and the secondary coil, the amplifier configured to generate the secondary voltage signal V2 based on the primary voltage signal V1 so that the target relationship is V2∝V1×A, where A is an amplification factor, and the amplifier comprises first and second sub-amplifiers, the first sub-amplifier connected between the first primary terminal and the first secondary terminal, and the second sub-amplifier connected between the second primary terminal and the second secondary terminal.

14. An integrated circuit comprising the transformer circuitry according to claim 13.

15. A transformer circuitry, comprising:

a transformer having a primary coil and a secondary coil, the primary coil having first and second primary terminals and the secondary coil having first and second secondary terminals; and a secondary coil driver configured to drive a secondary voltage signal V2 across the secondary terminals which has a target relationship with a primary voltage signal V1 driven across the primary terminals by a primary coil driver so that an inductance value measured between the primary terminals is governed by the target relationship, wherein the secondary coil driver is implemented as the primary coil driver and a capacitor network connected between the primary coil and the secondary coil, the capacitor network configured to apply a scaled version of the primary voltage signal V1 to the secondary coil as the secondary voltage signal so that the target relationship is V2∝V1×S, where S is a scaling factor, and the capacitor network comprises first and second capacitive potential dividers, the first capacitive potential divider connected so that a voltage signal applied at the first secondary terminal is dependent on a voltage signal applied at the first primary terminal, and the second capacitive potential divider connected so that a voltage signal applied at the second secondary terminal is dependent on a voltage signal applied at the second primary terminal.

16. An integrated circuit comprising the transformer circuitry according to claim 15.

17. The transformer circuitry according to claim 4, wherein the secondary coil driver is configured to control the amplification factor A based on a control signal to control the target relationship.

18. An oscillator circuit comprising the transformer circuitry according to claim 1.

* * * * *